United States Patent [19]

Omura et al.

[11] Patent Number: 5,103,415
[45] Date of Patent: Apr. 7, 1992

[54] COMPUTER-SIMULATION TECHNIQUE FOR NUMERICAL ANALYSIS OF SEMICONDUCTOR DEVICES

[75] Inventors: Ichiro Omura, Yokohama; Shin Nakamura, Kawasaki; Akio Nakagawa, Hiratsuka, all of Japan

[73] Assignee: Kabushiki Kaisha Toshiba, Kawasaki, Japan

[21] Appl. No.: 461,005

[22] Filed: Jan. 4, 1990

[30] Foreign Application Priority Data

Jan. 13, 1989 [JP] Japan .................................. 1-6221
Sep. 19, 1989 [JP] Japan .................................. 1-242826

[51] Int. Cl.$^5$ ............................................ G06F 15/00
[52] U.S. Cl. ................................. 364/578; 364/488
[58] Field of Search .............. 364/578, 488, 489, 490

[56] References Cited

U.S. PATENT DOCUMENTS 4,920,400  4/1990  Barsony ............................. 357/58
4,968,932 11/1990  Baba et al. ...................... 324/158 D

OTHER PUBLICATIONS

M. S. Adler et al., "Theory and Breakdown Voltage for Planar Devices with a Single Field Limiting Ring," IEEE Trans. Electric Devices, ED-24, pp. 107–113, Feb. 1977.
S. Yasuda et al., "High-Voltage Planar Junction with a Field-Limiting Ring," Solid-State Electron, vol. 25, No. 5, pp. 423–427, 1982.

Primary Examiner—Parshotam S. Lall
Assistant Examiner—M. J. Zanelli
Attorney, Agent, or Firm—Oblon, Spivak, McClelland, Maier & Neustadt

[57] ABSTRACT

A method of computing an internal potential distribution of a semiconductor device is disclosed which includes an electrically floating semiconductor layer as a floating potential region, thereby evaluating the breakdown voltage characteristic of the device by means of simulation. According to this method, when a trial value of a quasi-Fermi potential of the semiconductor layer is given, a Poisson equation is solved with use of the trial value, thus finding the potential distribution of the device. A characteristic point is obtained from the potential distribution. It is determined whether or not the relationship between the characteristic point and the trial value satisfies a specific relational expression. If the specific relational expression is satisfied, the trial value is determined to be the quasi-Fermi potential of the semiconductor layer, and the solution of the Poisson equation is output as a simulation calculation result. If the specific relational expression is satisfied, the trial value is corrected, and the Poisson equation is solved once again with use of the corrected trial value. This process is repeated until the specific relational expression is satisfied.

11 Claims, 18 Drawing Sheets

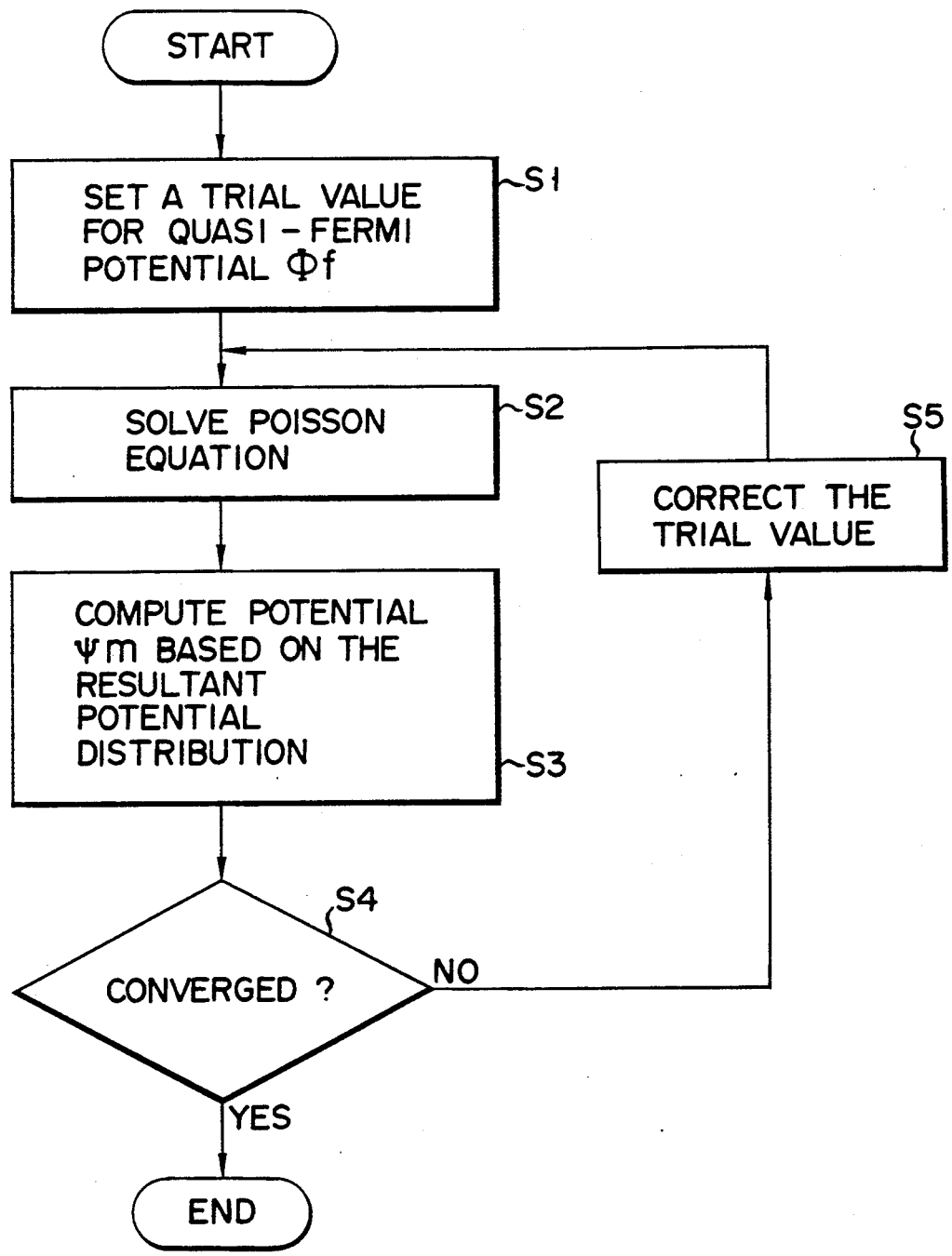
F I G. 2

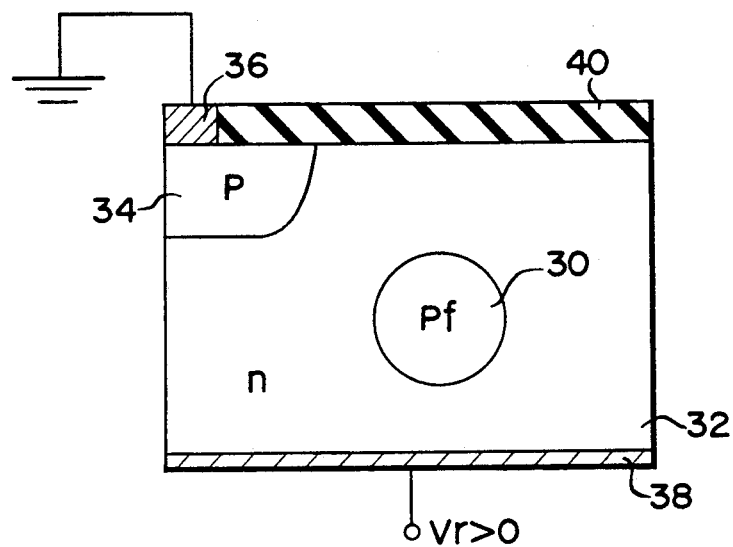
F I G. 3
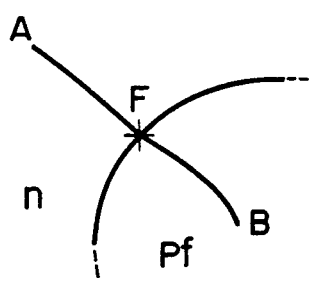
F I G. 4
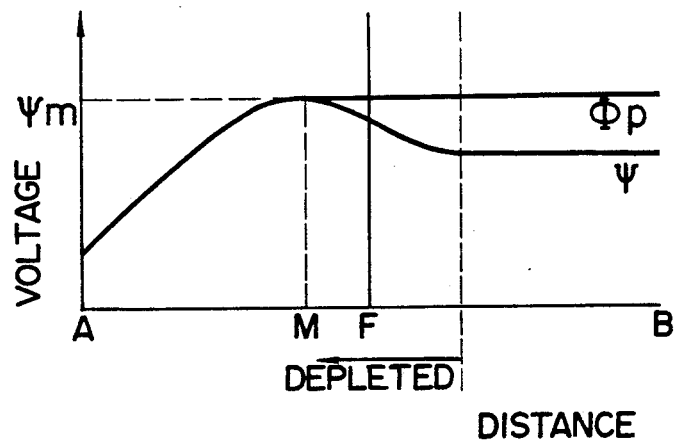
F I G. 5

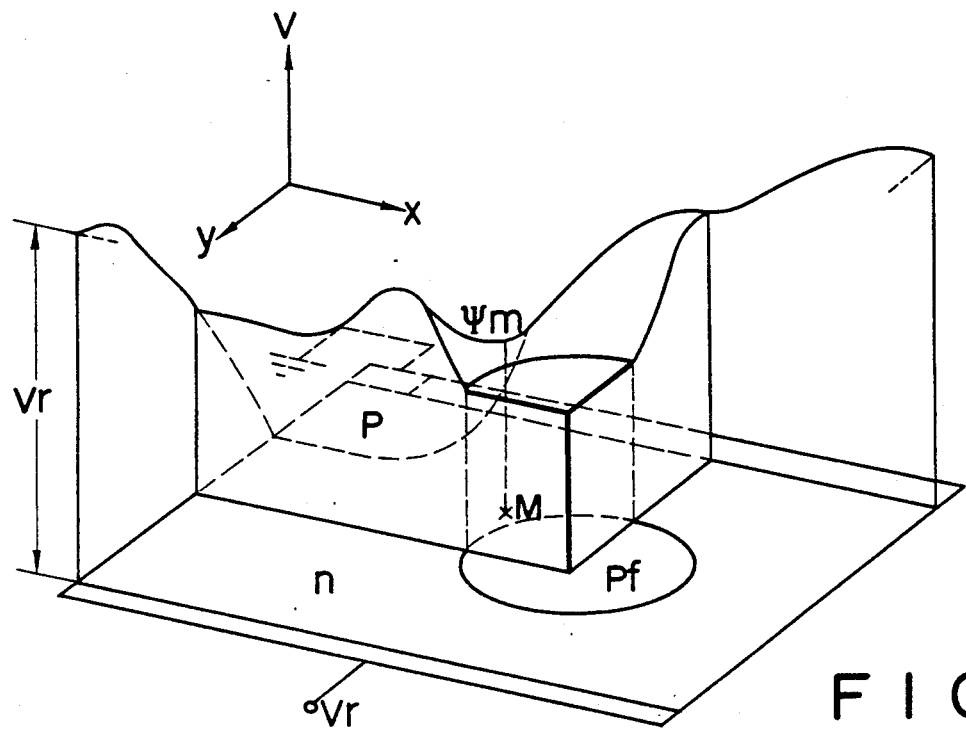
F I G. 6
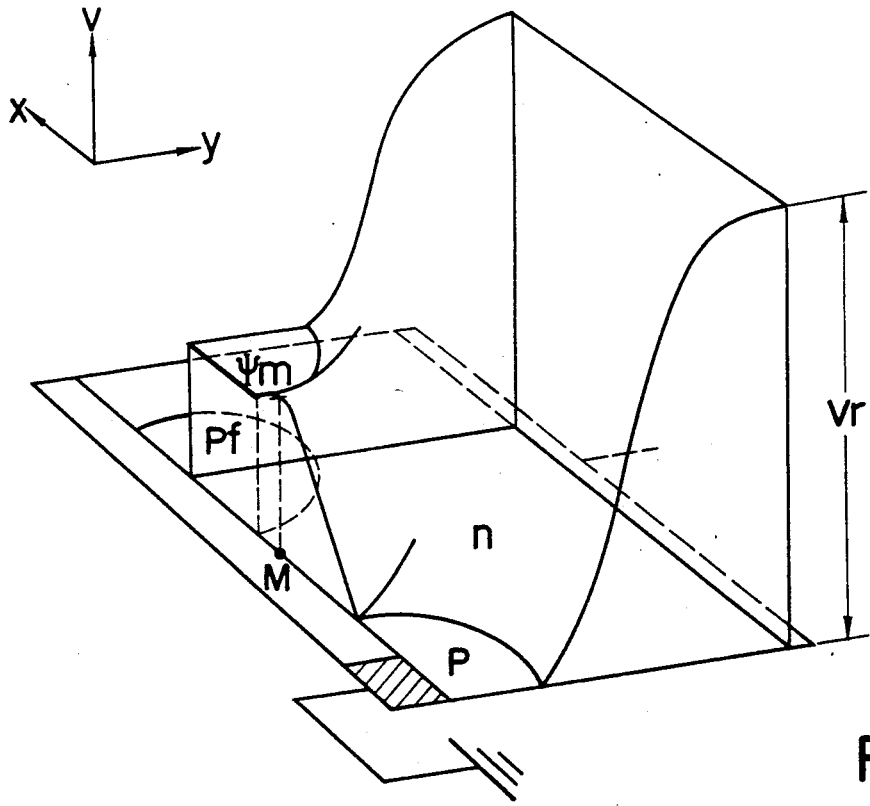
F I G. 7

$p = 5.0 \times 10^{16}$  $p_f = 5.0 \times 10^{16}$
$n^- = 8.0 \times 10^{13}$  $n^+ = 3.0 \times 10^{17}$
$w = 78.5 \mu m$  $w_1 = 13.5 \mu m$
$d = 55.0 \mu m$  $d_1 = 12.5 \mu m$
$d_2 = 27.5 \mu m$  $d_3 = 15.0 \mu m$

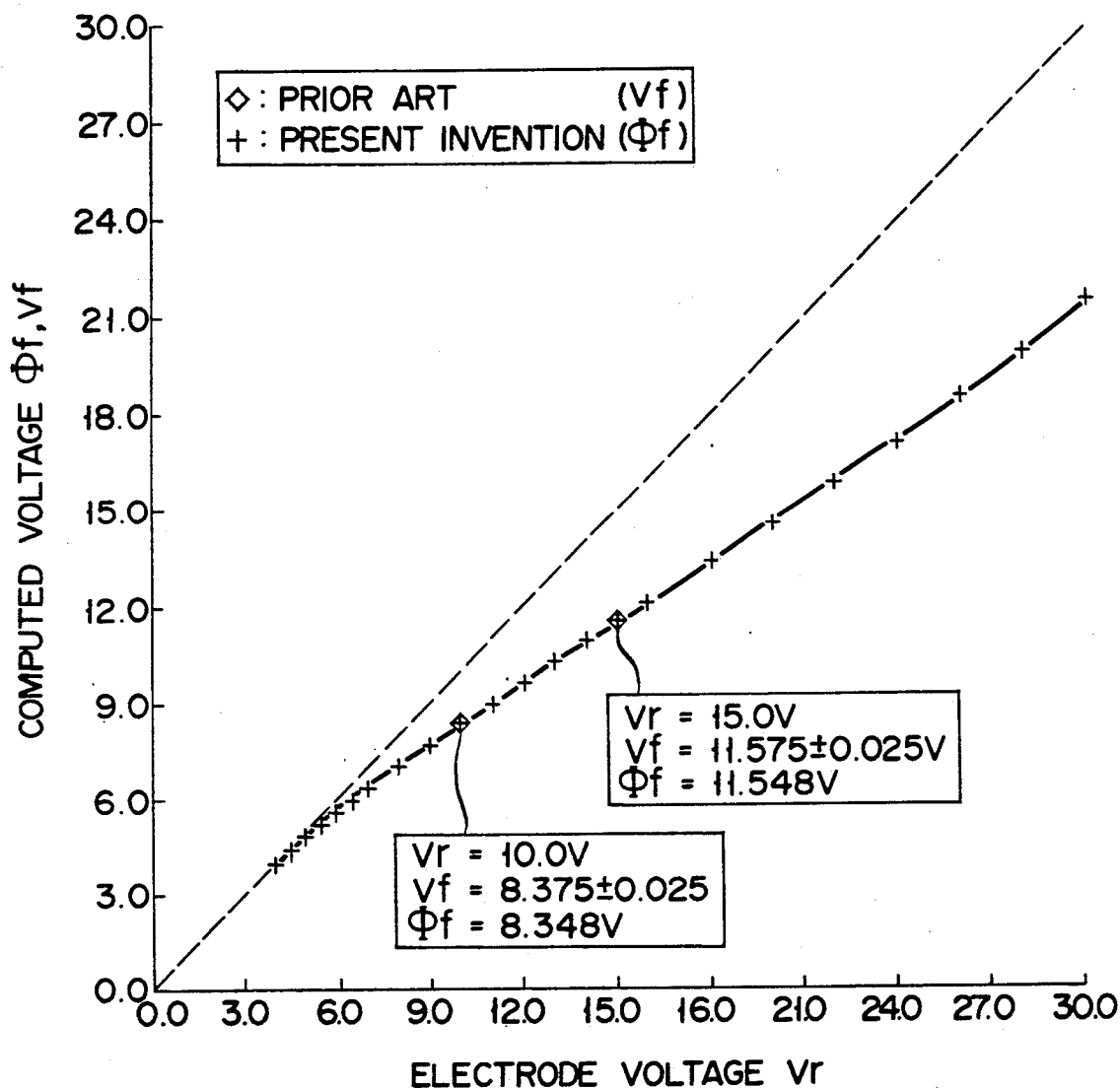
F I G. 10

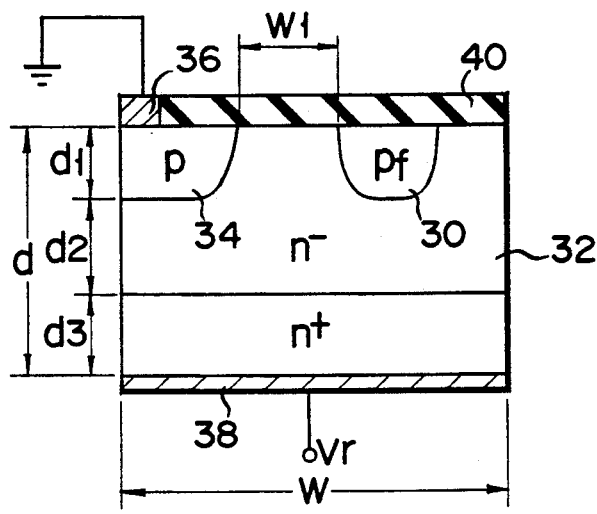
$p = 5.0 \times 10^{16}$   $pf = 2.0 \times 10^{14}$
$n^- = 8.0 \times 10^{13}$   $n^+ = 3.0 \times 10^{17}$
$W = 78.5 \mu m$   $W1 = 13.5 \mu m$
$d = 55.0 \mu m$   $d1 = 12.5 \mu m$
$d2 = 27.5 \mu m$   $d3 = 15.0 \mu m$
F I G. 11

$p = 5.0 \times 10^{18}$  $p_f = 5.0 \times 10^{18}$
$n^- = 8.0 \times 10^{13}$  $n^+ = 3.0 \times 10^{17}$
$W = 398.0 \mu m$  $W_1 = 42.0 \mu m$
$d = 220.0 \mu m$  $d_1 = 50.0 \mu m$
$d_2 = 110.0 \mu m$  $d_3 = 60.0 \mu m$ $p = 5.0 \times 10^{16}$  $pf = 5.0 \times 10^{16}$
$n^- = 8.0 \times 10^{13}$  $n^+ = 3.0 \times 10^{17}$
$w = 78.5 \mu m$
$d = 55.0 \mu m$  $d1 = 12.5 \mu m$
$d2 = 27.5 \mu m$  $d3 = 15.0 \mu m$

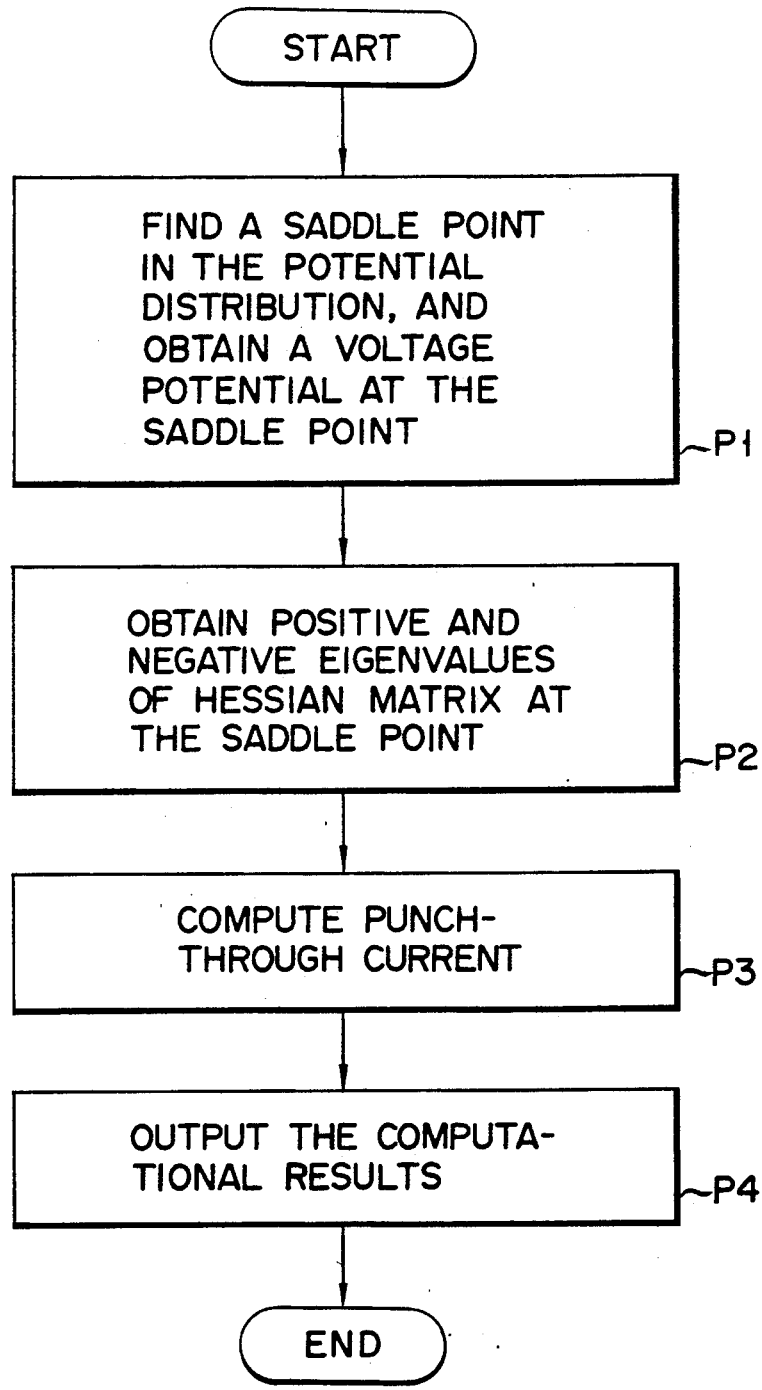
F I G. 16

F I G. 17A 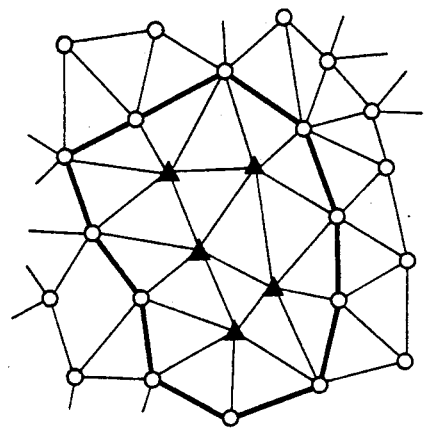
F I G. 17B 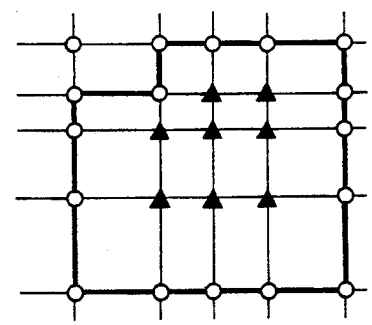
F I G. 17C 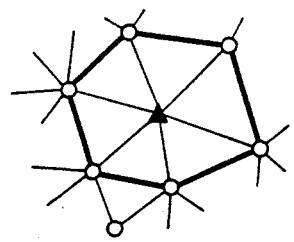
F I G. 17D 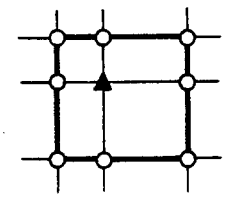

COMPUTER-SIMULATION TECHNIQUE FOR NUMERICAL ANALYSIS OF SEMICONDUCTOR DEVICES

BACKGROUND OF THE INVENTION

1. Field of the Invention

The present invention relates generally to a simulation evaluation technique, and more particularly to a simulation method of evaluating by numerical computation the characteristics of semiconductor devices.

2. Description of the Related Art

A computer simulation technique, as an advantageous method, has recently been employed to analyze and evaluate the characteristics of semiconductor devices. For example, the avalanche breakdown voltage of a certain semiconductor device can be computed by a computer by means of ionization integration, if the potential distribution of the semiconductor device is given. However, a presently available computer simulation method suffers from a technical limitation wherein the method is not fully applicable to various cases.

For example, in the case where a diffusion layer with a floating potential exists within a semiconductor device, the avalanche breakdown voltage distribution characteristic of the semiconductor device cannot be easily computed. If an approximated model is used, the potential distribution cannot be computed accurately as required; in order to obtain highly accurate voltage distribution, complex equations in combination must be processed repeatedly, resulting in a low calculation efficiency.

SUMMARY OF THE INVENTION

It is therefore an object of the present invention to provide a new and improved simulation technique for computing a given semiconductor device characteristic exactly and at high speed.

In accordance with the above object, the present invention is addressed to a specific simulation method for computing an internal potential distribution of a semiconductor device including therein an electrically floating semiconductor layer as a floating potential region. According to this method, when a trial value of a quasi-Fermi potential of the semiconductor layer is given, a Poisson equation is solved with use of the trial value, thus obtaining a solution representative of the potential distribution of the device. A characteristic point is found from the potential distribution. It is then verified and determined whether or not the relationship between the potential value of the characteristic point and the trial value satisfies a specific relational expression. If such verification is successful in that the specific relational expression is satisfied, the trial value is then determined to be the quasi-Fermi potential of the semiconductor layer, and the solution of the Poisson equation is output as a simulation calculation result. On the other hand, if the verification is failed, the trial value is corrected or updated, and the Poisson equation is solved once again with use of the corrected trial value. This process will be repeated until the specific relational expression is satisfied.

The present invention and its objects and advantages will become more apparent from a detailed description of preferred embodiments of the invention, which will be presented hereinafter.

BRIEF DESCRIPTION OF THE DRAWINGS

In the detailed description of preferred embodiments of the present invention presented below, reference is made to the accompanying drawings in which:

FIG. 2 is a flowchart illustrating main processes in a simulation computing method for analyzing the breakdown voltage characteristic of a semiconductor device according to a preferred embodiment of the present invention;

FIG. 3 is a diagram showing a cross-sectional structure of a semiconductor device to be simulated, wherein an electrically floating p-type diffusion layer is formed within a semiconductor substrate;

FIG. 4 is a diagram showing a point where a forward current starts to flow in a pn-junction between the electrically floating p-type diffusion layer and the substrate, and a curve including this point;

FIG. 5 is a graph showing a potential distribution on a current curve A-B in FIG. 4;

FIG. 6 is a three-dimensional graph showing a potential distribution in a cross-sectional area at the time of reverse biasing, in the model shown in FIG. 3;

FIG. 7 is a three-dimensional graph showing a potential distribution in a cross-sectional area at the time of reverse biasing, in another model;

FIGS. 8, 10, 12 and 14 are graphs showing computation data obtained when the simulation computing method of the present invention was actually carried out in order to evaluate the breakdown voltage characteristics of four typical device models;

FIGS. 9, 11, 13 and 15 are diagrams showing parameters of the four typical device models;

FIG. 16 is a flowchart illustrating the main processes in a simulation computing method for a semiconductor device, according to another embodiment of the present invention;

FIGS. 17A to 17D are diagrams showing typical examples of closed-loop regions, which are defined by connecting certain points selected among spatially dispersed point-lattices in order to find a saddle point of potential distribution;

DETAILED DESCRIPTION OF THE PREFERRED EMBODIMENTS

Figure 1:
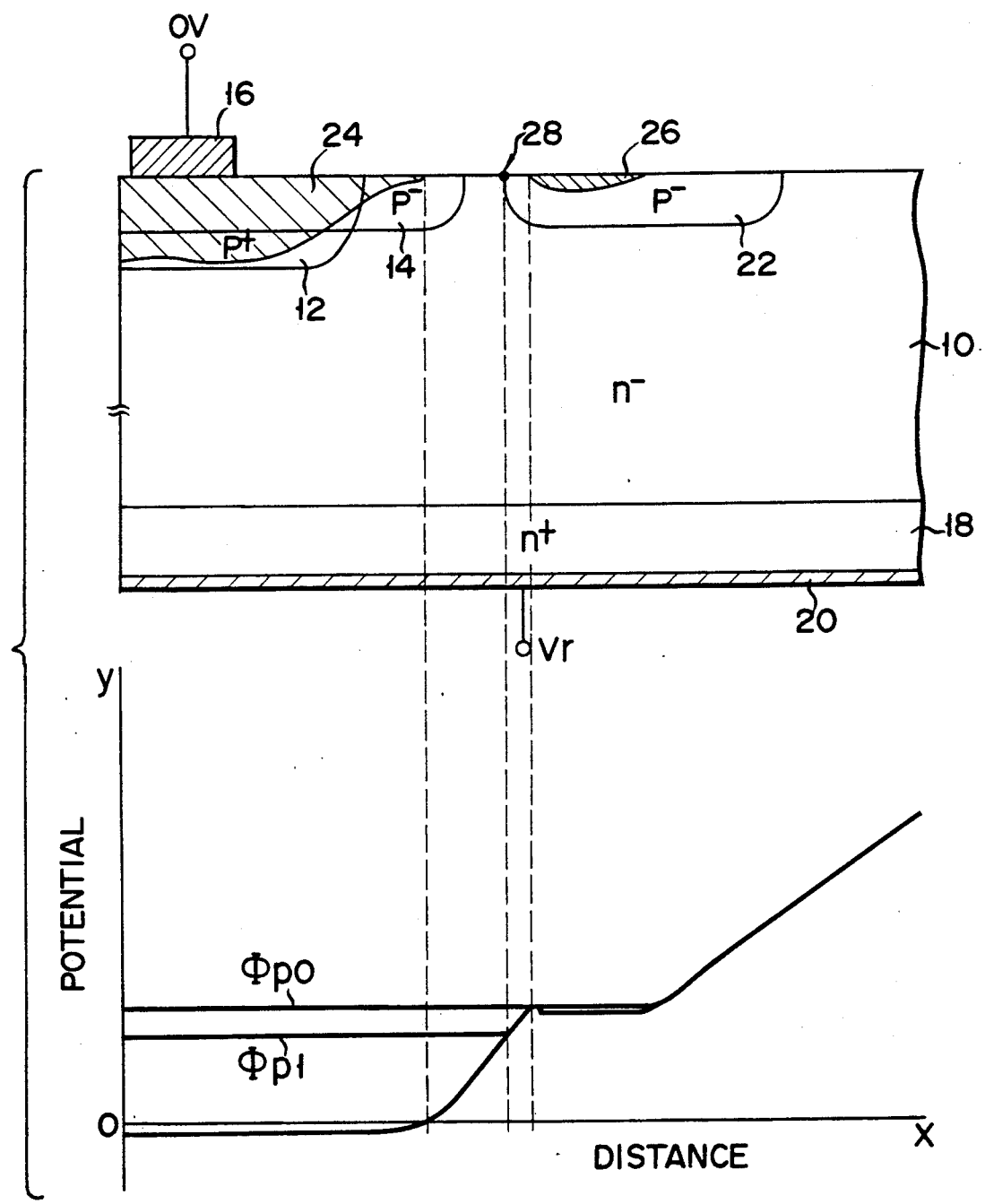
FIG. 1 is a diagram including a cross-sectional view of a conventional semiconductor device to be subjected to a simulation computing and a graph showing a potential distribution in the device.

Prior to the description of preferred embodiments of the present invention, a conventional simulation technique will be first described for better understanding of a basic concept of the present invention.

In general, the breakdown voltage characteristic (avalanche breakdown voltage characteristic) of a semiconductor device can be computed by a computer by means of ionization integration technique if the potential distribution within the device is given. In the case where a floating potential region, such as an electrically floating diffusion layer, is formed within the device, the breakdown voltage characteristic may be analyzed, basically, by one of the following two methods.

A first method is the method of solving basic equations relating to semiconductor in accordance with Newton's Method. In this case, an electrode is imaginarily located in a diffusion layer. The potential of the electrode is set such that the value of an electric current flowing through the imaginary electrode is zero. Based on this potential, a potential distribution is found. The basic equations relating semiconductor are the following set of equations:

$$\left. \begin{array}{l} o = (-1/q)\, div\, Jp + Gp - Up \\ o = (1/q)\, div\, Jn + Gn - Un \\ p = -q\, Dp\, gradp - q\, \mu p\, p\, grad\psi \\ n = q\, Dn\, gradn - q\, \mu n\, p\, grad\psi \\ div\, (\epsilon \cdot grad\psi) = -q(Nd - Na + p - n) \end{array} \right\} \quad (1)$$

where "q" is electronic charge, "p" is hole density, "n" is electron density, "$\psi$" is potential, "Dp" is hole diffusion constant, "Dn" is electron diffusion constant, "$\mu p$" is hole mobility, "$\mu n$" is electron mobility, "Nd" is donor impurity density, "Na" is acceptor impurity density, "$\epsilon$" is semiconductor dielectric constant, "Gp" is hole generation rate, "Gn" is electron generation rate, "Up" is hole recombination rate, "Un" is electron recombination rate, "Jp" is hole current density vector, and "Jn" is electron current density vector.

According to this simulation method, however, the amount of calculation necessary for one Newton repetition is enormous, and the convergence of calculation in this method is worse than that obtained by solving Poisson equations. Further, since it is very difficult to estimate the potential of an imaginary diffusion layer electrode, there is no choice but to find the electrode potential in a hit-and-miss manner. This results in an undesirable increase in arithmetic operation time of a computer. When two or more electrically floating diffusion layers exist within the semiconductor device, the above-described problems are aggravated. Consequently, the simulation analysis for valid potential distribution would become substantially impossible. Alternatively, when an electrically floating depletion layer extends within the semiconductor device to the vicinity of the imaginary electrode owing to the presence of the electrically floating diffusion layer, the obtained simulation results would differ largely from the actual values. The reason for this is that in the simulation computation it is supposed that no depletion layer is formed. Even if the problem of "depletion" is overcome, the convergence of calculation would be degraded.

The second method consists of finding the potential distribution in the device only by solving Poisson equations. A typical example of the second method is disclosed in "Theory and Breakdown Voltage for Planar Device with a Single Field-Limiting Ring" by M. S. Adler et al., IEEE Trans., ED-24, No. 2, 1977 at p. 107. In this case, a quasi-Fermi potential of many carriers in a floating potential region such as an electrically floating layer is obtained, as will be described hereinafter.

When the floating diffusion layer in a semiconductor device has a p-type conductivity, hole quasi-Fermi potential $\Phi p$ is set so as to be equal to a minimum value of the potential on the boundary region between the electrically floating diffusion layer and the semiconductor substrate. On the other hand, when the electrically floating diffusion layer has an n-type conductivity, the electron quasi-Fermi potential $\Phi n$ is set so as to equal to a maximum value of the potential in the boundary region between the electrically floating diffusion layer and the semiconductor substrate. In comparison with the first method, the second method is relatively simple with respect to the simulation calculation. However, when the electrically floating diffusion layer is depleted to a degree higher than a predetermined value, or when the depletion layer extends within the semiconductor substrate to form another electrically floating diffusion layer, the aforementioned-minimum value or maximum value is displaced from the actual quasi-Fermi potential, and the precision of the simulation calculation is degraded.

FIG. 1 shows a model of an example of the above case. The upper part of FIG. 1 shows a main region of a cross-sectional structure of a semiconductor device, for example, a high breakdown voltage planar diode, while the lower part of FIG. 1 is a graph showing a potential distribution. In this example, a substrate 10 is a lightly-doped n (n−) type silicon layer of high resistivity. A heavily-doped p (p+) type layer 12 and a lightly-doped p (p−) type layer 14 are formed in a top surface portion of the substrate 10 such that the layers 12 and 14 overlap each other, as shown in FIG. 1 The layers 12 and 14 serve as anode layers of the diode. An anode electrode 16 is formed on the top surface of substrate 10 so as to be brought into electrical contact with the anode layers 12 and 14. A heavily-doped n (n+) type layer 18 is defined on a bottom surface of n-type substrate 10. A cathode electrode 20 is attached to the substrate 10 with the layer 18 interposed therebetween. An electrically floating p-type diffusion layer 22 is located in the top surface portion of substrate 10. The layer 22 should be considered to be a girdling layer for surrounding the anode layers 12 and 14. The girdling layer 22 is apart from the anode layers 12 and 14 at a predetermined distance.

In order to evaluate the breakdown voltage characteristic of the above diode structure by means of the second simulation analysis method, it is imperative that the potential of the electrically floating p-type diffusion layer 22 be computed as precisely as possible. Suppose that all p-type regions of the diode are depleted, excepting hatched neutral regions 24 and 26. In this situation, the quasi-Fermi potential of the neutral region 26 of the electrically floating p-type diffusion layer 22 is $\Phi p0$, as shown in the lower part of FIG. 1. However, despite this fact, according to the second method, it is point 28 that has a minimum potential in the boundary region between the p-type diffusion layer 22 and the n-type substrate 10. Thus, the potential Φpl of this point 28 would be employed as a quasi-Fermi potential of the present model. As shown in FIG. 1, since the potential Φpl is lower than the actual potential Φp0, the difference therebetween acts as a factor that may cause an error in the simulation calculation. The precision of the simulation analysis result is naturally lowered.

In the prior art, when even one electrically floating diffusion layer exists in the semiconductor device, it is difficult to find the quasi-Fermi potential of the device exactly. In particular, where the inner part of the electrically floating layer is depleted, the analysis of the potential distribution per se would become impossible.

Fortunately, the above problems can be solved by embodiments of the present invention, which will be described in detail.

According to one preferred embodiment of the present invention, consideration is given the case where a diffusion layer, which is electrically floating from the other regions, is included in a semiconductor device that is to be evaluated by simulation. In order to find the quasi-Fermi potential of the electrically floating diffusion layer and the potential distribution in the device, a new equation representative of the relationship between a saddle point in a potential distribution curve, or an equivalent characteristic point, and a floating potential point is introduced. Simultaneous equations consisting of this new equation and a Poisson equation are solved thereby finding the quasi-Fermi potential and the internal potential distribution. The novel equation will be stated later, as equation (7).

More specifically, as shown in FIG. 2, a trial value (initial value) Φf is given for quasi-Fermi potential of the electrically floating diffusion layer (step S1). With use of the trial value Φf, a Poisson equation is solved (step S2). Then, in step S3, from the calculation result relating to the potential distribution, potential Ψm at the saddle point (or the equivalent characteristic point) is found. Hereinafter, this potential is called "characteristic point potential". In step S4, it is determined whether the characteristic point potential Ψm and the trial value Φf satisfy the aforementioned novel equation. In other words, it is determined whether the characteristic point potential Ψm converges or not. In the case where the characteristic point potential Ψm and the trial value Φf do not satisfy the newly introduced equation, that is, where the characteristic point potential Ψm does not converge, the trial value Φf is corrected or updated in step S5. Using the corrected trial value Φf', the Poisson equation is solved once again. The steps of correcting the trial value Φf and solving the Poisson equation are repeated until the characteristic point potential converges.

With such an arrangement, equations or simultaneous equations relating to electric currents, which have been employed in the prior art, are not solved. Only the Poisson equation is solved, so that the amount of calculations per Newton repetition is small, and the property of convergence is improved. Since the the quasi-Fermi potential of the electrically floating diffusion layer is automatically found, the number of times of trials is reduced, and the total simulation calculation time is shortened. Even in the case where two or more electrically floating layers are present in the semiconductor device, the simulation analysis is fully effective. Even if the electrically floating diffusion layer is depleted, the potential distribution thereof can be calculated with high precision.

The Poisson equation for finding the internal potential distribution ψ of the semiconductor device is as follows:

$$div\,(\epsilon \cdot grad\psi) = -q(p-n+Nd-Na) \quad (2)$$

where "p" is hole density, "n" is electron density.

The values of p and n are given as follows:

$$p = ni \cdot exp[q(\psi p - \psi)/kT] \quad (3)$$

$$n = ni \cdot exp[q(\psi - \psi n)/kT] \quad (4)$$

where "ni" is carrier density of pure semiconductor, and "k" is Boltzmann constant.

In general, when a reverse biasing voltage is applied to a pn-junction of a semiconductor device, quasi-Fermi potentials Φp and Φn are regarded as being constant in a p-type region and an n-type region. Electrode potentials in a region adjacent to a majority carrier region are assigned to the quasi-Fermi potentials Φp and Φn. Using these values, equations (2), (3) and (4) are solved, thereby finding a potential distribution in the device.

When an electrically floating diffusion layer is present in the semiconductor device, the quasi-Fermi potentials Φp and Φn are not regarded as being constant. Thus, the above-described method is not directly applicable to this case. According to the present invention, the quasi-Fermi potential of majority carriers of the electrically floating layer is determined, based on the potential distribution in the device, as will be described in detail hereinafter.

FIG. 3 shows a model of a semiconductor device having an electrically floating diffusion layer 30. For the purpose of convenience, the electrically floating diffusion layer 30 is supposed to have a p-type conductivity. Reference numeral "32" denotes a substrate formed of an n-type semiconductor layer. A p-type layer 34 is formed in a top surface portion of the substrate 32. An electrode 36 is connected to a p-type layer 34. A conductive layer 38 is another electrode provided on a bottom surface of the substrate 32. The p-type diffusion layer 30 is embedded in the n-type substrate 32 and is not put in contact with either the electrode 36 or 38. Namely, the p-type diffusion layer 30 is electrically floating. The electrode 36 is connected to a ground. A voltage Vr is applied to the electrode 38, thereby providing a reverse bias between the layers 32 and 34. An insulating layer 40 made of a material such as silicon oxide is formed in the top surface of the n-type layer 32.

In the above-described model, the quasi-Fermi potential Φn of the n-type layer 32 and the quasi-Fermi potential Φp of the p-type layer 34, that is, the quasi-Fermi potentials of the parts excluding the electrically floating diffusion layer 30, are given by the following equations, if minority carriers are ignored:

$$\left.\begin{array}{l}\Phi p = Vr \\ \Phi n = 0\end{array}\right\} \quad (5)$$

The potential of the electrically floating diffusion layer 30, in fact, cannot be fixed. However, the quasi-Fermi potential Φp of the layer 30 is regarded as being constant, and this constant value is represented by Φ. When the quasi-Fermi potential Φf is determined, the following cases must be considered:

(I) Where a depletion layer formed by a pn-junction of layers 32 and 34 does not interfere with a depletion layer formed by a pn-junction between layers 30 and 32, and (II) Where a depletion layer formed by a pn-junction of layers 32 and 34 interferes with a depletion layer formed by a pn-junction between layers 30 and 32.

In the case (I), the quasi-Fermi potential Φf of the layer 30 is given by:

$$\Phi f = Vr \tag{6}$$

In this case, the potential of the p-type layer 30 coincides with the potential of the n-type layer 32, and there is no problem. On the other hand, in the case (II), the quasi-Fermi potential Φf coincides with the saddle point of the potential distribution of the device or with the potential of the equivalent characteristic point. How to determine the quasi-Fermi potential Φf in this case will now be described in detail.

In general, in a pn-junction, the value of a reverse current is substantially zero, and a large current flows by application of an even small forward bias voltage. In the device model shown in FIG. 3, a breakdown voltage at the time a reverse voltage is applied between the p-type layer 34 and n-type layer 32 will now be considered. At the moment an electric current begins to flow through a pn-junction between the electrically floating diffusion layer 30 serving as girdling and the n-type layer 32, most parts of the pn-junction are supplied with a reverse bias, and only a part thereof is initially supplied with a forward bias. This part is denoted by point F in FIG. 4. An electric current (flow of holes) is indicated by an electric current curve AB. The potential distribution on the curve AB is shown in the graph of FIG. 5. A maximum potential point (characteristic point) on the electric current curve AB is represented by "M", and the corresponding maximum potential value is indicated by symbol ΨM. In this situation, the forward bias current begins to flow, when the quasi-Fermi potential Φp of the electrically floating p-type diffusion layer 30 is equal to the maximum potential value Ψm. This condition is generally given by:

$$f = \Psi m + \alpha \tag{7}$$

This is a "new equation" representative of the relationship between the saddle point on the potential distribution curve, or the equivalent characteristic point, and the floating potential point. However, the value "α" is a correction term and is normally zero.

The equation (7) is used for the judgment of convergence in step S4 in the flowchart of FIG. 4, when the breakdown voltage of the device is computation-simulated. In other words, it is determined whether the trial value (initial value) of the currently set quasi-Fermi potential Φf and the potential value Ψm found in step S3 in FIG. 2 satisfy the equation (7). If these values fail to meet the equation (7), this trial value is corrected in step S5, and the Poisson equation is solved once again. With use of the obtained calculation result, the convergence is judged once again. This process is repeated until the convergence is attained.

The condition for setting the characteristic point M will now explained. In the above device model, the electric current curve AB has been determined relatively easily. However, in general devices, the electric current curve is not necessarily determined easily. In such a case, the following two cases are introduced:

(a) When a saddle point is present in the resultant voltage potential distribution, the saddle point is used as the characteristic point M.

(b) When the electrically floating diffusion layer is present on a boundary of the semiconductor region, if there is a point on the boundary which satisfies the following relationship, this point is employed as the characteristic point M:

$$\left. \begin{array}{l} \partial \psi / \partial n < 0, \\ \partial \psi / \partial \sigma = 0, \\ \partial^2 \psi / \partial \sigma^2 < 0 \end{array} \right\} \tag{8}$$

where ∂/∂n denotes a differentiation in an outward normal direction of the boundary, ∂/∂σ denotes a first-stage differentiation in a tangential direction of the boundary, and ∂²/∂²σ a second-stage differentiation in the tangential direction of the boundary.

In the condition (a), for example, according to the model shown in FIG. 3, a potential distribution in a cross-sectional area at the time of reverse bias is shown in FIG. 6. As seen from a three-dimensional graph showing the potential distribution, the forward current starts to flow from the saddle point M.

The condition (b) is effective, for example, in the model shown in FIG. 3, when the electrically floating p-type diffusion layer 30 is juxtaposed with the p-type layer 34 so as to contact a semiconductor (Si)/insulator (SiO₂) interface of the top surface portion of the n-type substrate. The internal potential distribution in this case is shown in the three-dimensional graph of FIG. 7. In FIG. 7, a top point M on the potential curve corresponds to the saddle point M (characteristic point) in FIG. 6.

When the actual simulation calculation is carried out, the equation (6) of case I and the equation (7) of case II are combined to obtain the following equation:

$$\Phi f = \min (\Psi m + \alpha, Vr) \tag{9}$$

The equation (9) and Poisson equations (2), (3) and (4) are simultaneously solved to find the potential Φf of the electrically floating p-type diffusion layer 30. The actual process in this case will be explained once again. In step S1 in FIG. 2, the trial value of the quasi-Fermi potential Φf of the electrically floating p-type diffusion layer 30 is set. In step S2, using the trial value, the Poisson equations (2), (3) and (4) are solved. In step S3, on the basis of the resultant potential distribution, the potential Ψm of the saddle point or characteristic point (M) is determined. In step S4, the convergence is judged, and it is determined whether or not the values Φf and Ψm satisfy the equation (9). If the value Φf is greater than min (Ψm+α, Vr), the trial value Φf is lowered in step S5. If the value Φf is smaller than min (Ψm+α, Vr), the trial value Φf is increased. Using the corrected trial value Φf, steps S2, S3 and S4 are repeated. If the convergence is attained in step S4, the simulation calculation is completed.

The above description is based on the supposition that the electrically floating p-type diffusion layer 30 is not depleted. However, in the case where the p-type diffusion layer 30 is depleted, the above-described simulation calculation is similarly effective, only if the range of numerical values of the quasi-Fermi potential Φf is determined, based on an intra-layer region where the carrier density of the layer 30 is equal to, or higher than, ni.

The inventors applied the above-described simulation calculation technique to the evaluation of breakdown voltage characteristics of actual various device structures. The experimental data obtained in this will be shown below.

This data well demonstrates the precision and speed of the simulation calculation according to the present invention.

The following four models were used in comparative experiments. As a conventional method to be compared to the four models, the first conventional method described in the introductory part of the description (i.e., the method wherein basic equations of semiconductor are solved by using the Newton's Method) was used.

Figure 8:
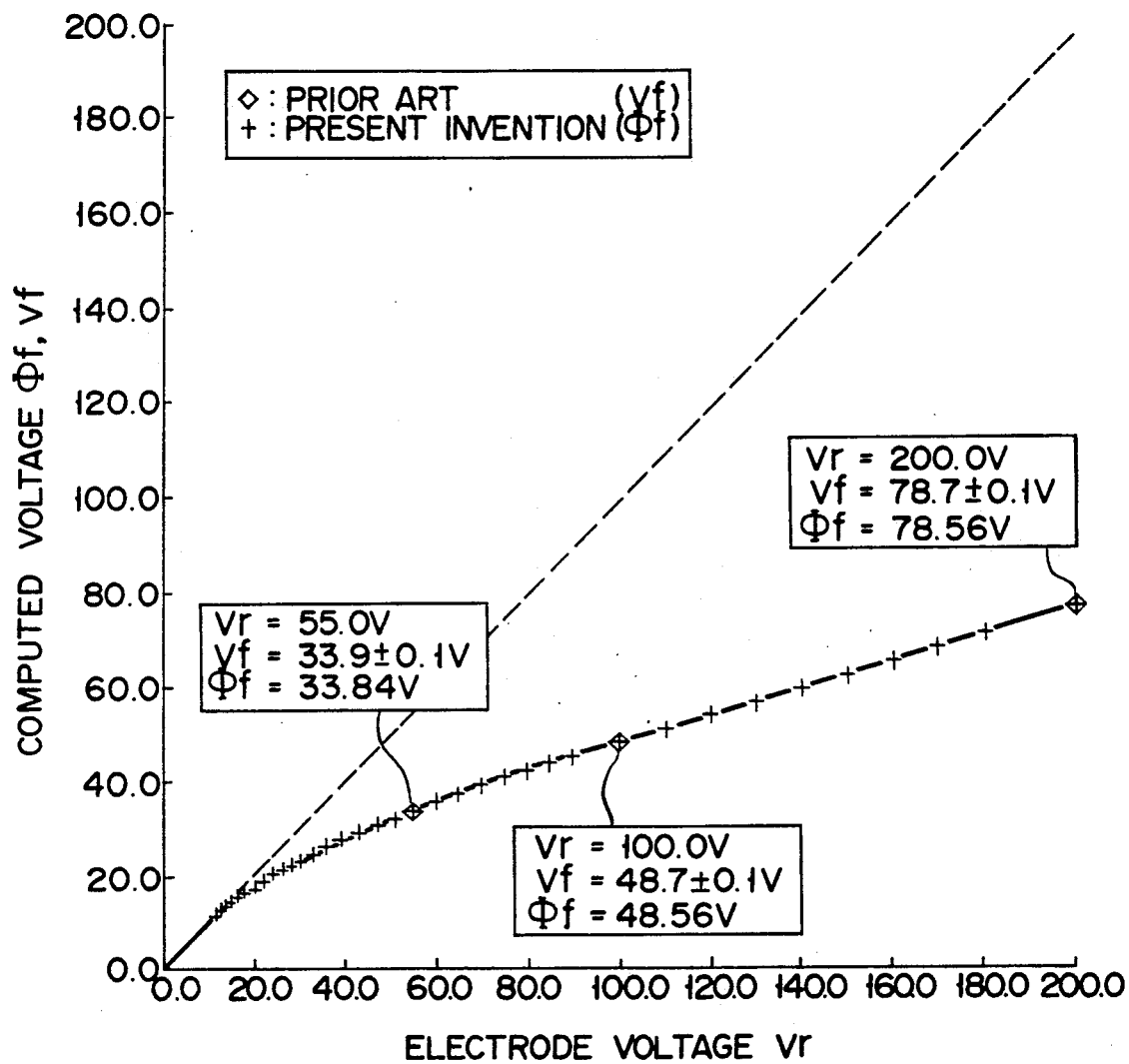
Figure 9:
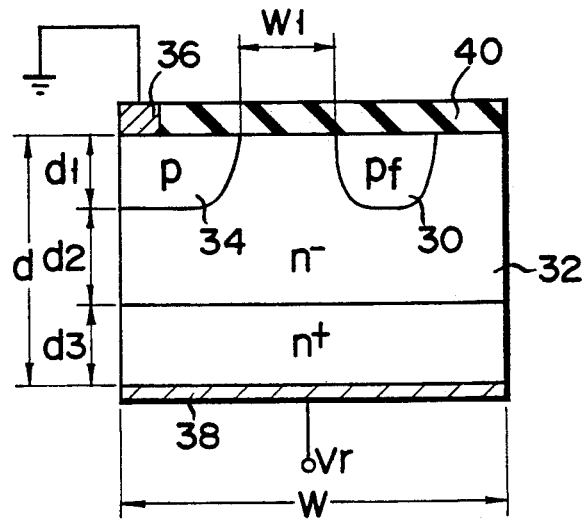

Model 1: A planar semiconductor diode having a popular girdling structure. The results of simulation calculation with this model are shown in FIG. 8, and parameters of the respective parts are shown in FIG. 9.

Model 2: A planar semiconductor diode having an electrically floating p-type diffusion layer (30) serving as a girdling, and having an impurity concentration lower than that of Model 1. The results of simulation calculation with this model are shown in FIG. 10, and parameters of the respective parts are shown in FIG. 11.

Figure 12:
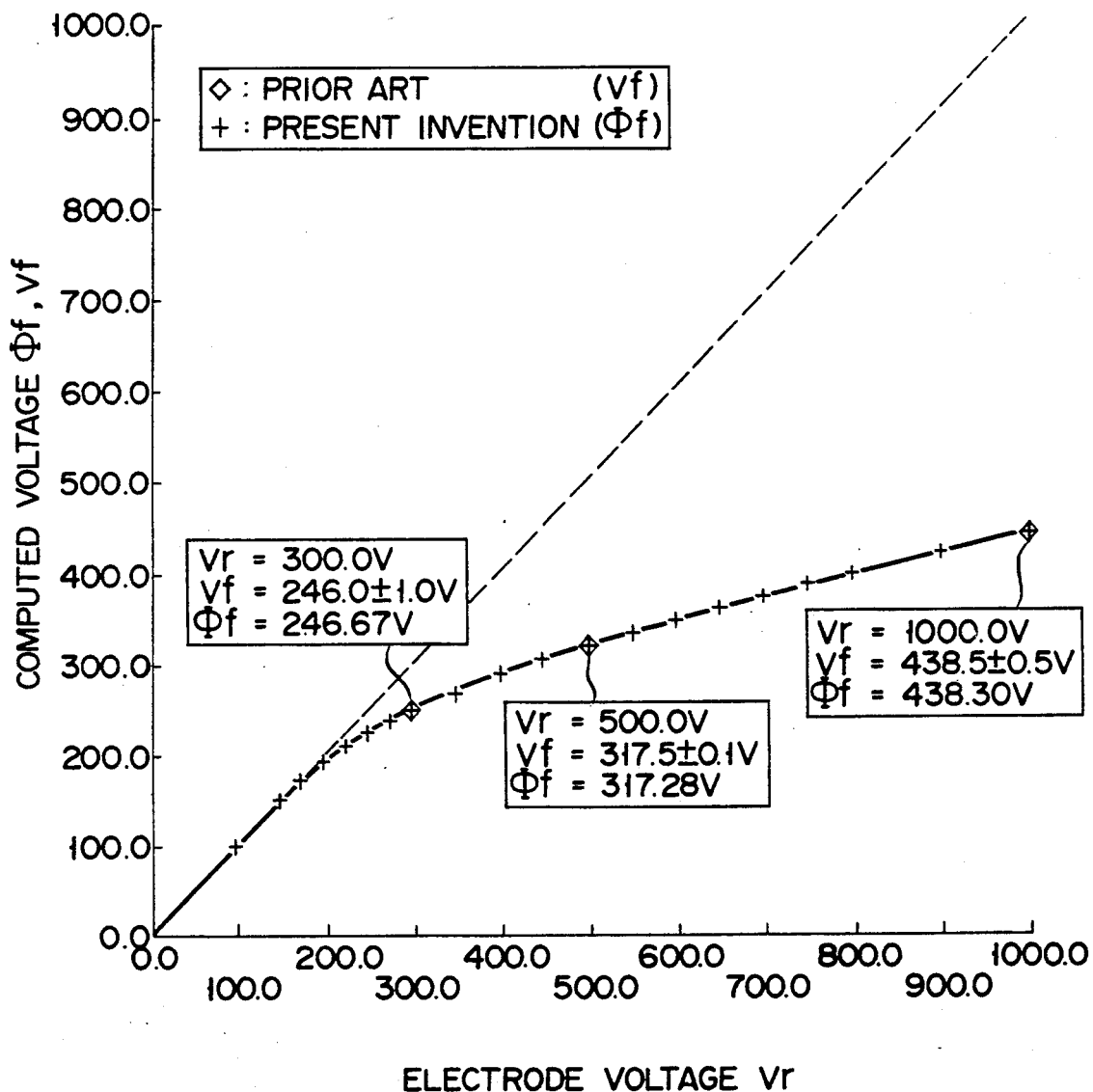
Figure 13:
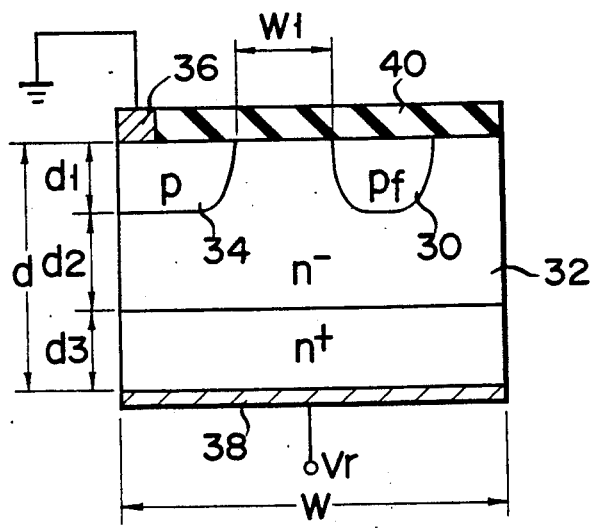

Model 3: A high-breakdown voltage planar semiconductor diode having a withstanding voltage of about 1,000 volts. The results of simulation calculation with this mode are shown in FIG. 12, and parameters of the respective parts are shown in FIG. 13.

Figure 14:
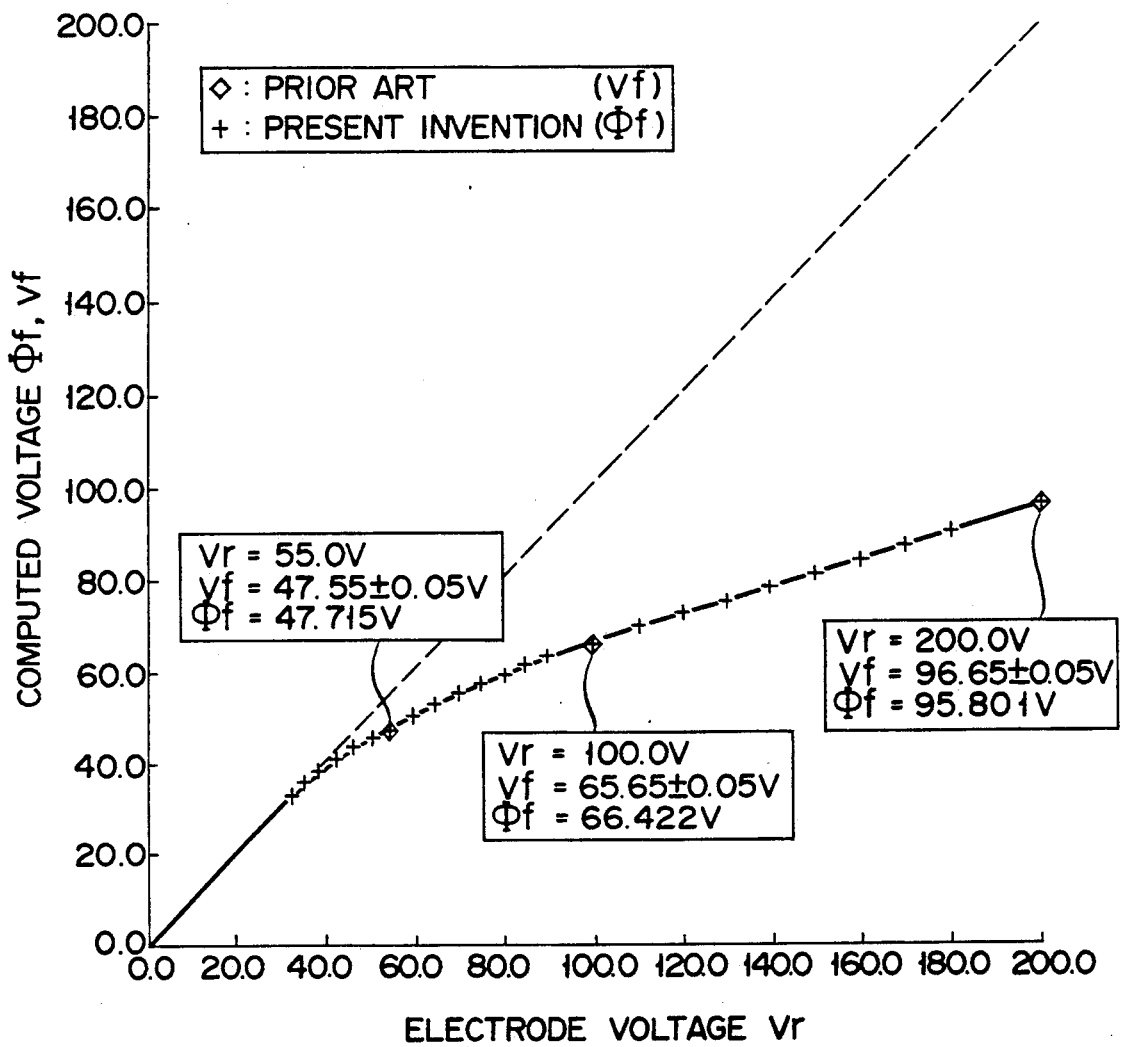
Figure 15:
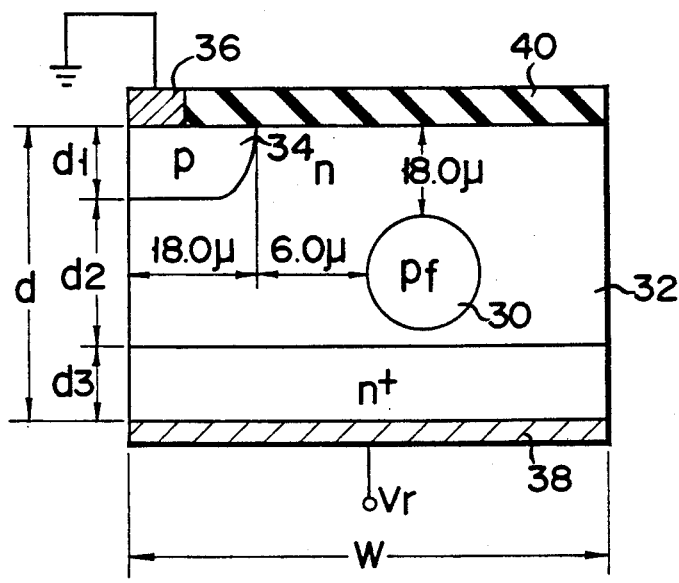

Model 4: A planar semiconductor diode having an electrically floating p-type diffusion layer (30) serving as a girdling, and having an impurity concentration which is as low as that of Model 2, wherein the p-type diffusion layer is embedded in an n-type substrate layer (32) and it is unclear through which portion a forward current flows from the electrically floating p-type diffusion layer. The results of simulation calculation with this model are shown in FIG. 14, and parameters of the respective parts are shown in FIG. 15.

In any one of the above models, the voltage calculation results (plotted by mark "◊" in each graph) obtained by using the simple simulation calculation technique of the present invention coincide with the voltage calculation results (plotted by mark "+" in each graph) obtained by using a conventional troublesome simulation calculation technique. In the present invention, high calculation precision can be maintained. According to the present invention, basically the Poisson equations are only solved. Thus, the total calculation amount is reduced to ⅓ to 1/9, compared to the conventional technique. Simultaneously, the convergence property can improve. Further, since the quasi-Fermi potential Φf of the electrically floating p-type diffusion layer (30), the number of trials can be reduced. This contributes to the decrease in calculation time. Furthermore, the simulation calculation method of the present invention is sufficiently effective, even if a plurality of electrically floating layers are present in the semiconductor layer. This method is also effective even if an electrically floating diffusion layer is depleted. Therefore, the problems of the first and second conventional simulation calculation methods can be solved completely.

A description will now be given of a simulation calculation method for a semiconductor device, according to a second embodiment of the present invention. FIG. 16 is a flowchart illustrating a simulation calculation method for a punch-through current in a semiconductor device. This method can provide an effective simulation analysis, even in the case where the direction of electric current does not coincide with any one of the directions of partial lines of meshes used in calculations.

In step P1 in FIG. 16, after an internal potential distribution of a semiconductor device to be simulated is calculated (for example, by means of the method of the first embodiment or other general method), a saddle point in a potential distribution curve is found. Subsequently, in step P2, positive and negative eigen-values of a Hessian matrix at the saddle point are obtained. In step P3, an equation relating to leakage current, which is defined by the saddle point potential, positive and negative eigenvalues, and given device bias conditions, is computed. The computational results are output in step P4.

How to find the saddle point in the potential distribution will now be described in detail. When a current distribution defined by spatially dispersed points is given, certain points selected from the dispersed points are connected by line segments, and a closed loop is defined. The potentials at lattice points included in the region within the loop (excluding lattice points on the loop line) are found. FIGS. 17A to 17D show typical examples wherein internal lattice points are indicated by mark "▲", and the loop is defined by a thick line. From among the found potentials of lattice points, a maximum potential a and a minimum potential b are obtained.

It is determined whether or not lattice points on the closed loop line (indicated by mark "○") in each of FIGS. 17A to 17D satisfy the following conditions:

i) There are at least two lattice points α that have potentials higher than the maximum potential a;

ii) There are at least two lattice points β that have potentials lower than the minimum potential b; and iii) In the case where given two points are selected from lattice points α and used as first selected points, and given two points are selected from lattice points α and are used as second selected points, a line segment connecting the first selected points and a line segment connecting the second selected points cross each other.

Figure 18:
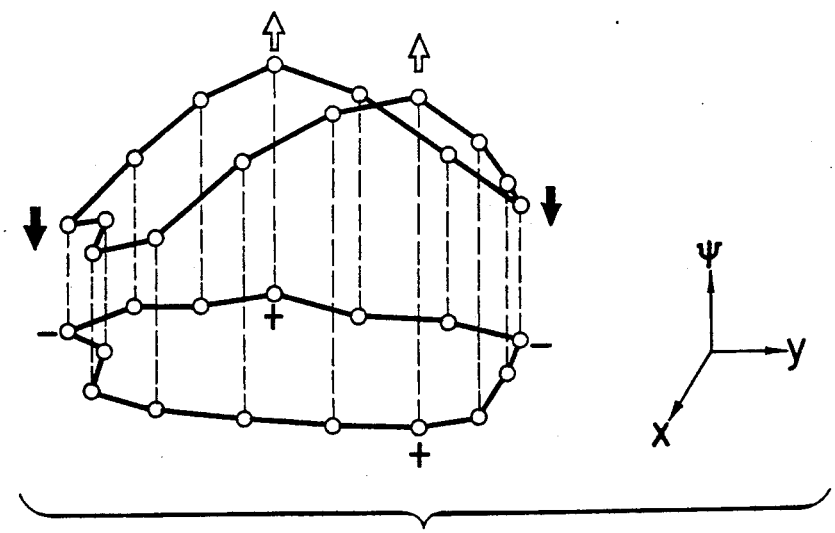
FIG. 18 is a diagram showing, in a three-dimensional manner, an example of potential distribution wherein a saddle point is present in a closed-loop region of potential distribution.

When the above three conditions are satisfied, it is determined that a saddle point exists in the closed loop region. FIG. 18 shows an example of the model which satisfies the three conditions are met. A closed loop line obtained by connecting given lattice points on an x-y plane is shown in the lower part of FIG. 18. The potential distribution ψ at the lattice points on the closed loop line is three-dimensionally illustrated, as a potential distribution curve, in the upper part of FIG. 18. The lattice points on the potential distribution curve, which are indicated by two upward white arrows are the first selected points with potentials higher than the maximum value a. The lattice points indicated by two downward black arrows are the second selected points with potentials lower than the minimum value b. Since the positional relationship between these first and second selected points satisfies the third condition, it is determined that the saddle point always exists in the internal potential distribution within the closed loop.

After the detection of the saddle point in the internal potential distribution of the semiconductor device, the positive and negative eigenvalues of the Hessian matrix at the saddle point are computed. More specifically, the potential distribution $\psi(x, y)$ is subjected to Taylor expansion around the saddle point P. We have then $$\psi(x, y) = \psi sp + (x, y) \, \text{Hess}\psi \, (P) \begin{pmatrix} x \\ y \end{pmatrix} \quad (10)$$

where $\psi sp$ is the voltage potential at saddle point P. Thus, the Hessian distribution $h(x, y)$ is given by $$h(x, y) \sim (x, y) \, \text{Hess}\psi \, (P) \begin{pmatrix} x \\ y \end{pmatrix} \quad (11)$$

Figure 19A:
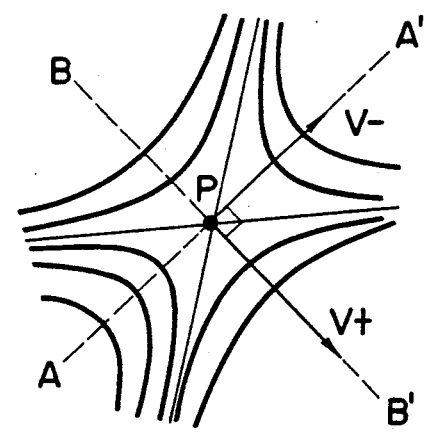
FIGS. 19A to 19C are diagrams showing the relationship between a distribution configuration of potential $\psi$ in the vicinity of saddle point P of potential distribution in a semiconductor device, and vectors $V+$ and $V-$.
Figure 19B:
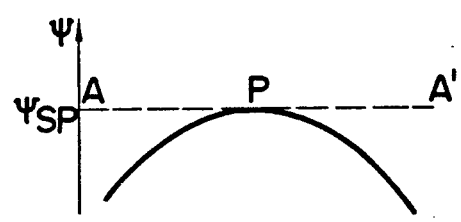
Figure 19C:
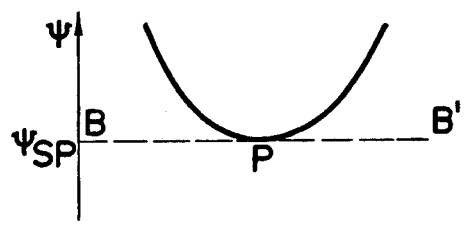

Suppose that the positive eigenvalue of the Hessian matrix Hess$\psi$ (P) is $\lambda+$, the negative eigenvalue of the Hessian matrix Hess$\psi$ (P) is $\lambda-$, and the eigenvectors of these eigenvalues $\lambda+$ and $\lambda-$ are $v+$ and $v-$. In this case, vectors $v+$ and $v-$ intersect at right angles with each other. FIGS. 19A to 19C show the relationship between the distribution configuration of the potential $\psi$ in the vicinity of saddle point P and the vectors $v+$ and $v-$. FIG. 19A shows a planar potential distribution. FIG. 19B is a graph showing a distribution cross section taken along line A—A' in FIG. 19A, and FIG. 19C is a graph showing a distribution cross section taken along line B—B' in FIG. 19A.

From these figures, it is clear that "potential troughs" appear on both sides of the saddle point P in the direction of line segment A—A', and this direction coincides with the direction of the eigenvector $v-$. It is also clear that "potential ridges" appear on both sides of the saddle point P in the direction of line segment B—B', and this direction coincides with the direction of the eigenvector $v+$.

Accordingly, an electric current (i.e., a flow of electrons in this embodiment) flows in the direction of $v+$. The coordinates are isometric-transformed to represent the $v+$ direction and $v-$ direction. With use of new coordinates $\xi$, $\eta$, $h(x, y)$ is given by the formula:

$$h(\xi, \eta) - \lambda + \cdot \xi^2 \lambda - \cdot \eta^2 \quad (12)$$

Thus, $$Z^*/L^* \sim (-\lambda+/\lambda-)^{\frac{1}{2}} \quad (13)$$

The punch-through current In is thus given by $$In = -qDn \cdot ni \, (-\lambda+/\lambda-)^{\frac{1}{2}} \cdot \exp\left\{ \frac{q}{kT} (\psi sp - V1) \right\} \times \quad (14)$$

$$\left[ 1 - \exp\left\{ -\frac{q}{kT} (V2 - V1) \right\} \right]$$

where V1 and V2 denote the potentials of two n-type regions of a target pnp structure. If the value of the right term of equation (14) is found by computational calculation, the value of the punch-through current can be precisely obtained. When the punch-through current is a flow of holes, the symbols in the above formulae may be inverted.

The inventors actually calculated a punch-through current of a semiconductor device, by mean of the aforementioned calculation methods. The calculation results will be stated hereinafter.

Figure 20:
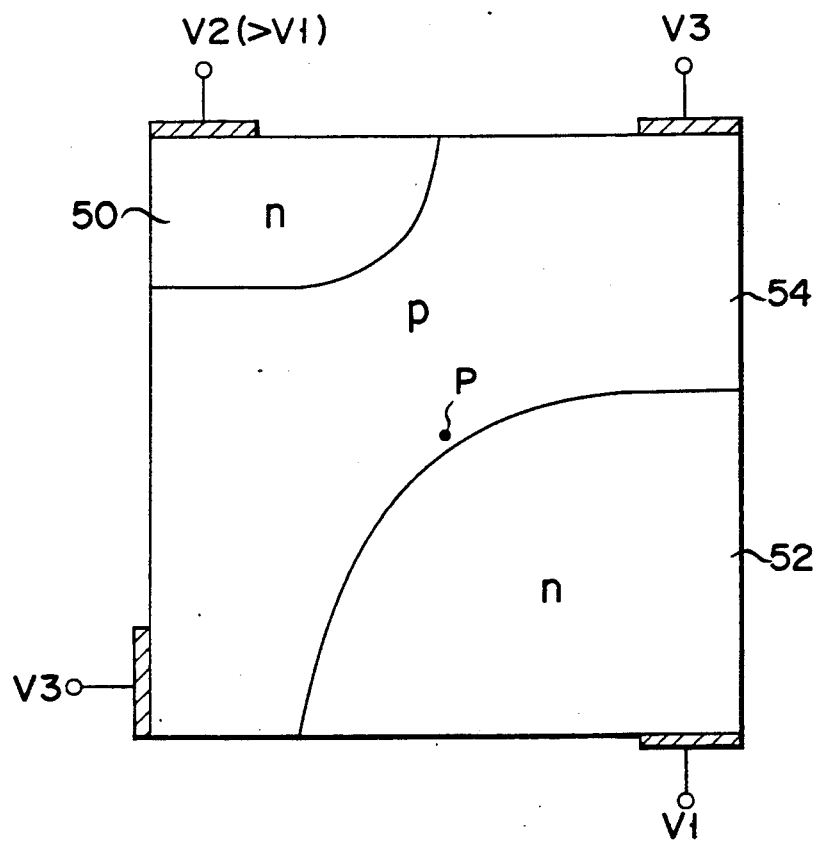
FIG. 20 is a diagram showing a cross-sectional structure of a semiconductor device to be simulated, which has a PNP-structure within a semiconductor substrate.
Figure 21:
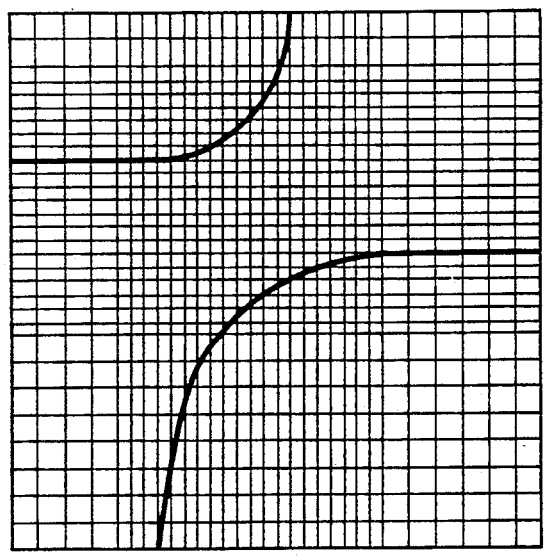
FIG. 21 is a mesh-diagram showing, in a dispersed manner the internal potential within the device region shown in FIG. 20.
Figure 22:
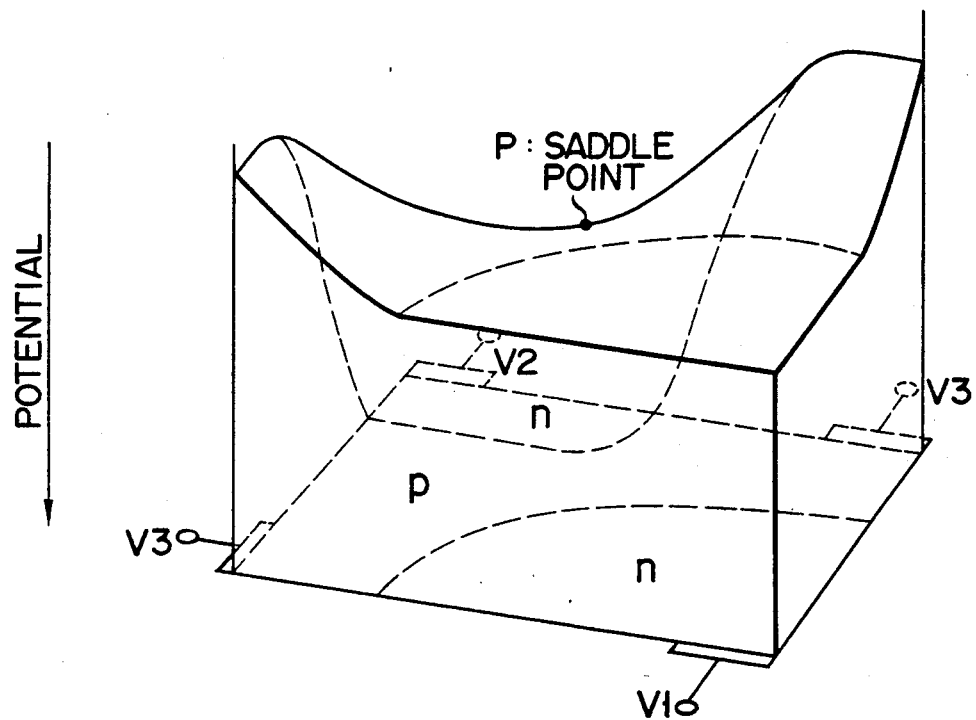
FIG. 22 is a three-dimensional graph showing a potential distribution pattern within the device shown in FIG. 20.

FIG. 20 shows a cross-sectional structure of a target semiconductor element. Two n-type semiconductor regions 50 and 52 are formed in a p-type semiconductor substrate layer 54, thus constituting a PNP Structure. Voltage V1 is applied to the n-type region 52. Voltage V2 is higher than the voltage V1, and is applied to the n-type region 50. As shown in FIG. 20, voltage V3 is applied to a p-type layer 54. FIG. 21 is a mesh graph showing the internal potentials of the device region discretely. As is obvious from FIG. 21, the mesh is finer in a region including pn-junctions and saddle point p than in the remaining region. FIG. 22 is a graph showing, in a three-dimensional manner, a potential distribution pattern in the device shown in FIG. 20, wherein the saddle point is indicated by symbol "P".

Figure 23:
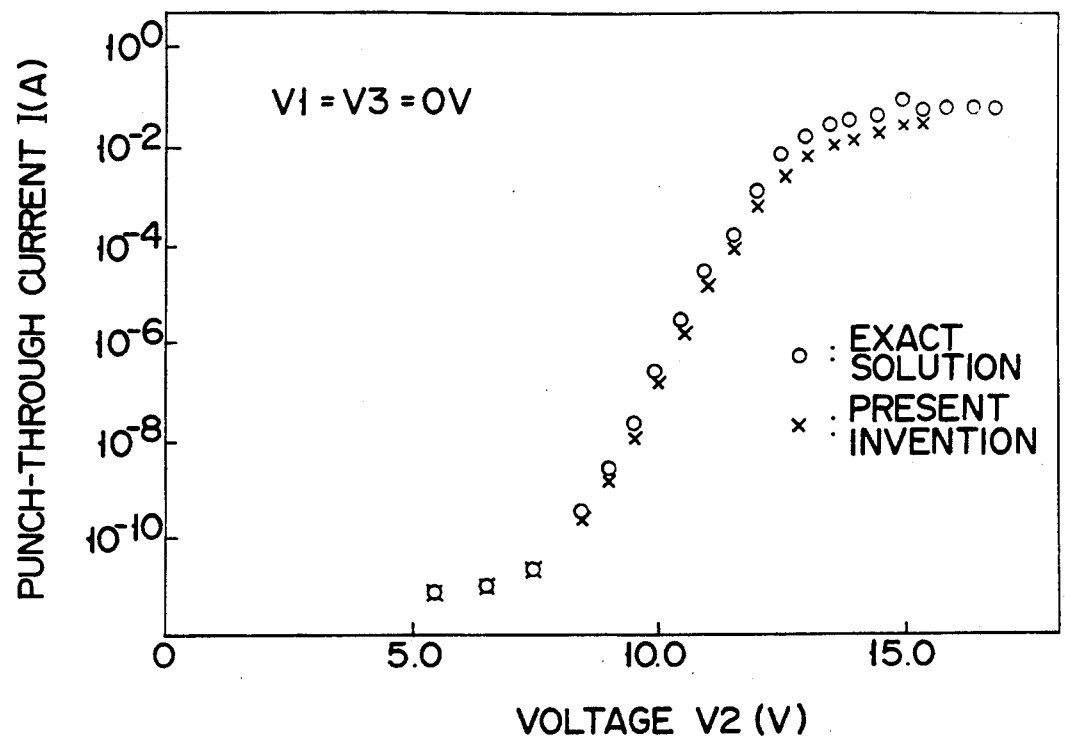
FIG. 23 is a graph showing the dependency of a punch-through current upon the potential V2 of an n-type region, which is found by actually carrying out the simulation calculation with respect to the model-analysis structure.
Figure 24:
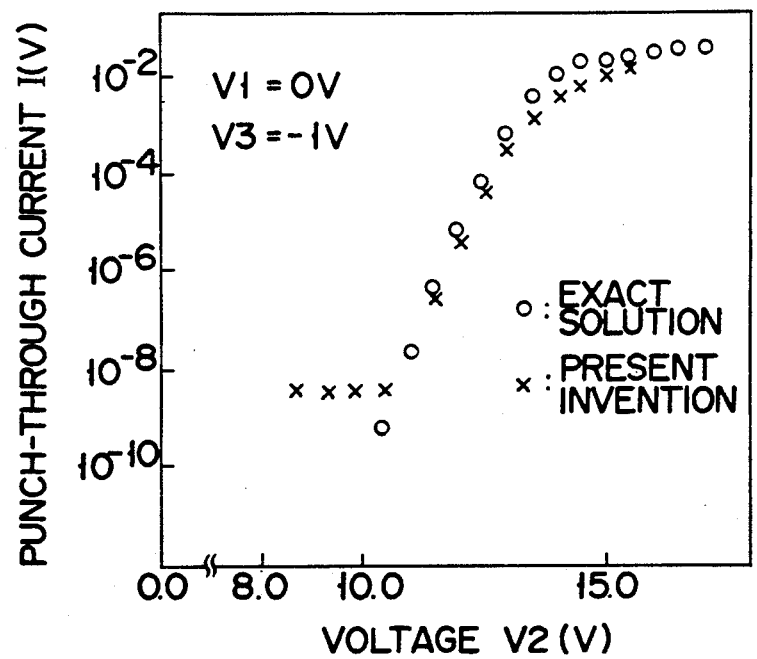
FIG. 24 is a graph showing the dependency of a punch-through current upon the potential V2 of an n-type region, which is found by actually carrying out the simulation calculation with respect to the model-analysis structure under different conditions.

FIG. 23 shows the dependency of a punch-through current upon potential V2 of n-type region 50, the punch-through current being obtained by actual simulation computation carried out on the aforementioned model analysis structure. In FIG. 23, a characteristic curve plotted by mark "○" denotes an exact solution, and a characteristic curve plotted by mark "×" denotes the results obtained by using the simulation calculation technique of the present invention. The exact solution is obtained by solving an equation of current-continuation, with a great deal of time being taken, with respect to all regions of the device structure. The voltages V1 and V3 were set to 0V. FIG. 24 is a graph showing, in comparison with the exact solutions, the simulation calculation results, in the same condition as above, excepting that the value of the applied voltage was changed such that V1=−0V and V3=−1 V. It is clear from just viewing these graphs that the simulation calculation results of the present invention are very close to the exact solutions. According to the present invention, even if the direction of current does not agree with the direction of the analysis mesh, the leakage current such as punch-through current can be computed by simulation with high precision and at high speed, based on the internal potential distribution of the semiconductor device, irrespective of the type of the analysis mesh.

What is claimed is:

1. A method of stimulating an internal potential distribution of a semiconductor device including an electrically floating semiconductor layer, comprising the steps of:

obtaining a representation of the internal potential distribution of the semiconductor device by solving a Poisson equation in a computer means using a trial value of a quasi-Fermi potential of the semiconductor layer;

selecting a value of a characteristic point in the potential distribution including a saddle point;

analyzing the characteristic point to determine whether or not the relationship between the value of the characteristic point and the trial value satisfies a specific relational expression which has been stored in the computer means;

determining said trial value as being a quasi-Fermi potential when said specific expression is satisfied; and obtaining a simulated internal potential distribution by solving the Poisson equation using said computer means;

wherein the step of selecting said characteristic point comprises:

defining a closed loop from spatially dispersed points defining a current distribution, determining potentials at lattice points included in a region defined by said loop, determining a maximum potential and a minimum potential of said lattice points, and determining said saddle point exists in said defined loop when at least two lattice points on said loop have potentials higher than said maximum potential, at least two lattice points on said loop have potentials lower than said minimum potential, and a first line segment connecting two points selected from said lattice points having potentials higher than said maximum potential and a second line segment connecting two points selected from said lattice points having potentials lower than said minimum potential cross each other.

2. The method according to claim 1, wherein, when said specific equation is not satisfied, said trial value is corrected and said Poisson equation is solved once again with use of the corrected trial value, and an updated solution is subjected to said determination step.

3. The method according to claim 2, wherein said trial value is corrected repeatedly until said specific relational equation is satisfied.

4. The method according to claim 3, wherein said specific relational equation is defined by $$\Phi f = min(\Psi m + \alpha, Vr)$$

where $\Phi f$ is trial value of the quasi-Fermi potential, $\Psi m$ is value of the characteristic point, and $Vr$ is electrode potential of the semiconductor device.

5. The method according to claim 4, wherein said Poisson equation is defined by $$div\ (\epsilon \cdot grad\psi) = -q(p - n + Nd - Na)$$

where p=hole density and n=electron density, the hole density and electron density being defined by $$p = ni \cdot exp[q(\Phi p - \psi)/kT]$$

$$n = ni \cdot exp[q(\psi - \Phi n)/kT]$$

where ni is carrier density of pure semiconductor, and k is Boltzmann constant.

6. The method according to claim 4, further comprising the steps of:

computing positive and negative eigenvalues of a Hessian matrix of the potential value at the saddle point; and computing a leakage current within the device, by using the eigenvalues thus computed and a bias condition of the semiconductor device.

7. The method according to claim 6, wherein said leakage current includes a punch-through current produced in a pn-junction structure within said device.

8. A method of stimulating an internal leakage current of a semiconductor device including a pn-junction structure, comprising the steps of:

obtaining a representation of an internal voltage distribution of the semiconductor device by using a computer means;

selecting a characteristic point in the potential distribution which includes a saddle point, and extracting the potential value at the characteristic point;

computing positive and negative eigenvalues of a Hessian matrix of the value at the characteristic point; and determining a leakage current within the semiconductor device by using the eigenvalues thus computed and a bias condition of the semiconductor device stored in said computer means;

wherein the step of selecting said characteristic point comprises:

defining a closed loop from spatially dispersed points defining a current distribution, determining potentials at lattice points included in a region defined by said loop, determining a maximum potential and a minimum potential of said lattice points, and determining said saddle point exists in said defined loop when at least two lattice points on said loop have potentials higher than said maximum potential, at least two lattice points on said loop have potentials lower than said minimum potential, and a first line segment connecting two points selected from said lattice points having potentials higher than said maximum potential and a second line segment connecting two points selected from said lattice points having potentials lower than said minimum potential cross each other.

9. The method according to claim 8, wherein said leakage current includes a punch-through current produced in said device.

10. A method of obtaining a simulated internal potential distribution of a semiconductor device having an electrically floating semiconductor layer thereby to model electrical breakdown characteristics of the device, comprising the steps of:

obtaining an approximated internal potential distribution of the semiconductor device by solving a Poisson equation using a trial value of a quasi-Fermi potential of the floating semiconductor layer;

selecting as a characteristic point a saddle point in said approximated internal potential distribution;

comparing said characteristic point to said trial value to determine whether a predetermined relational expression relating said characteristic point and said trial value is satisfied;

adjusting said trial value and repeating said obtaining, selecting and comparing steps when said predetermined relational expression is not satisfied; and determining said trial value as a quasi-Fermi potential of said electrically floating layer and said approximated internal potential distribution as said internal potential distribution when said predetermined expression is satisfied;

wherein the step of selecting said characteristic point comprises:

defining a closed loop from spatially dispersed points defining a current distribution, determining potentials at lattice points included in a region defined by said loop, determining a maximum potential and a minimum potential of said lattice points, and determining said saddle point exists in said defined loop when at least two lattice points on said loop have potentials higher than said maximum potential, at least two lattice points on said loop have potentials lower than said minimum potential, and a first line segment connecting two points selected from said lattice points having potentials higher than said maximum potential and a second line segment connecting two points selected from said lattice points having potentials lower than said minimum potential cross each other.

11. A method as recited in claim 10, comprising:

determining said electrical breakdown characteristics of said semiconductor device using said internal potential distribution.

* * * * *